United States Patent
Ichikawa et al.

(10) Patent No.: US 7,851,335 B2
(45) Date of Patent: Dec. 14, 2010

(54) ADHESIVE COMPOSITION, ADHESIVE SHEET AND PRODUCTION METHOD OF SEMICONDUCTOR DEVICE

(75) Inventors: Isao Ichikawa, Tokyo (JP); Naoya Saiki, Tokyo (JP); Hironori Shizuhata, Tokyo (JP)

(73) Assignee: Lintec Corporation, Tokyo (JP)

( * ) Notice: Subject to any disclaimer, the term of this patent is extended or adjusted under 35 U.S.C. 154(b) by 28 days.

(21) Appl. No.: 12/415,613

(22) Filed: Mar. 31, 2009

(65) Prior Publication Data

US 2009/0246913 A1    Oct. 1, 2009

(30) Foreign Application Priority Data

Mar. 31, 2008   (JP) .............................. 2008-091251

(51) Int. Cl.
*H01L 21/301*   (2006.01)

(52) U.S. Cl. ................. 438/464; 428/355 EP; 156/329; 523/209

(58) Field of Classification Search ................. 438/464; 523/209; 156/329; 428/355 EP
See application file for complete search history.

(56) References Cited

U.S. PATENT DOCUMENTS

| | | |
|---|---|---|
| 5,110,388 A | 5/1992 | Komiyama et al. |
| 5,118,567 A | 6/1992 | Komiyama et al. |
| 5,356,949 A | 10/1994 | Komiyama et al. |
| 5,739,263 A * | 4/1998 | Yoshida et al. .............. 528/353 |
| 6,277,481 B1 | 8/2001 | Sugino et al. |
| 2005/0165196 A1* | 7/2005 | Kinoshita et al. ............. 528/28 |
| 2007/0276066 A1* | 11/2007 | Ohno et al. ................. 524/186 |

FOREIGN PATENT DOCUMENTS

| | | |
|---|---|---|
| EP | 0359373 A2 | 3/1990 |
| EP | 0971011 A2 | 1/2000 |
| JP | 2032181 A | 2/1990 |
| JP | 8239636 A | 9/1996 |
| JP | 10008001 A | 1/1998 |
| JP | 2000017246 A | 1/2000 |

* cited by examiner

*Primary Examiner*—George Fourson
(74) *Attorney, Agent, or Firm*—The Webb Law Firm

(57) ABSTRACT

The object of the present invention is to provide an adhesive composition that enables to produce conforming products with a high manufacturing yield and without breaking or chipping of the chips in the picking-up step and that enables to stably connect a wire without contaminating a wire pad part disposed at the circumference of a bonding surface during a wire bonding step that is performed after die bonding, even in the case of chips being reduced in a thickness.

The adhesive composition of the present invention comprises:
 (A) an acrylic polymer;
 (B) an epoxy resin;
 (C) a thermosetting agent; and
 (D) a silicone compound having a specific side chain.

12 Claims, 1 Drawing Sheet

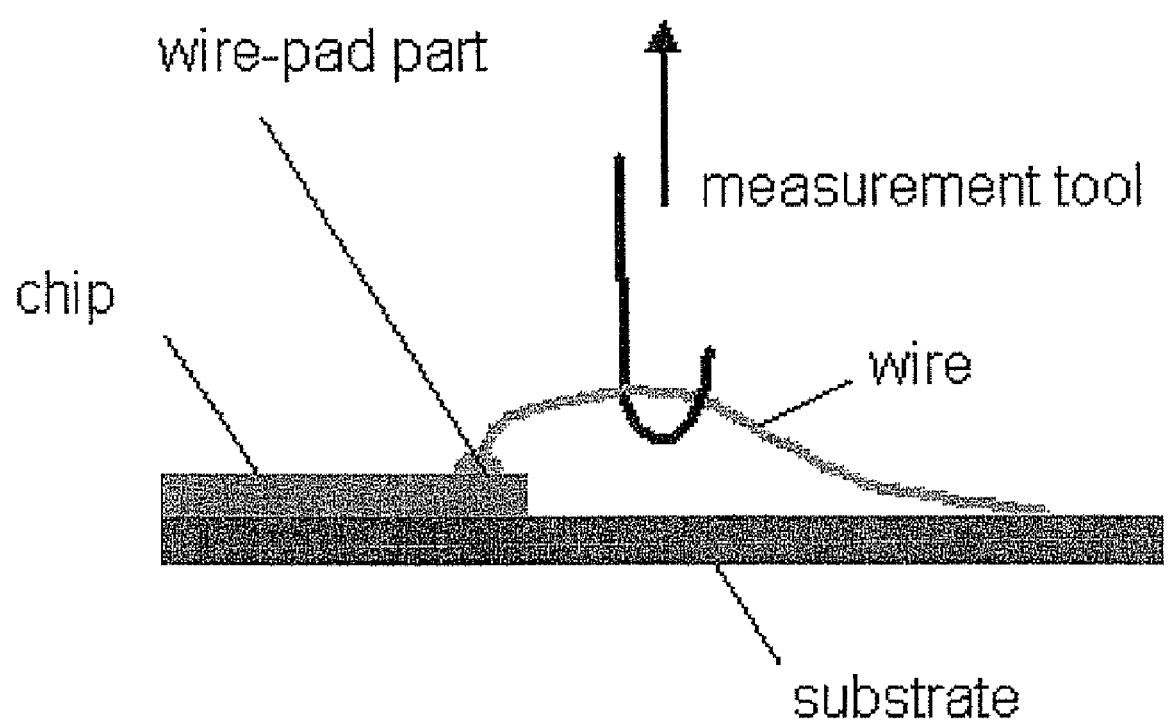

ADHESIVE COMPOSITION, ADHESIVE SHEET AND PRODUCTION METHOD OF SEMICONDUCTOR DEVICE

BACKGROUND OF THE INVENTION

1. Field of the Invention

The present invention relates to an adhesive composition which is particularly suited for using at dicing step where chips are obtained from a semiconductor wafer and a step of die-bonding a chip on an organic substrate or a lead frame and the like, an adhesive sheet having an adhesive layer comprising the above adhesive composition and a production method of a semiconductor device using the above adhesive sheet.

2. Description of the Related Art

A semiconductor wafer of silicon, gallium arsenide or the like is produced in a large size, and this wafer is cut and separated (dicing) into small element pieces (chips) and then transferred to a die-bonding step which is a subsequent step. In this case, the semiconductor wafer is subjected to the respective steps of dicing, washing, drying, expanding and picking-up in the state that it is adhered advance on an adhesive sheet, and then it is transferred to a die-bonding step which is a subsequent step.

In order to simplify the picking-up step and the die-bonding step among the above steps, various adhesive sheets for dicing and die-bonding which are provided with both a wafer-fixing function and a die-adhering function at the same time are proposed (for example, refer to patent documents 1 to 4).

Adhesive sheets comprising a base material and, formed thereon, an adhesive layer comprising a specific composition are disclosed in the patent documents 1 to 4. The above adhesive layer has a function of fixing a wafer in dicing the wafer, and when picking up the chip after finishing dicing, the adhesive layer is peeled off from the base material together with the chip. When the chip provided with the adhesive layer is mounted on a die-pad part of a substrate and heated, an adhesive strength of a thermosetting resin contained in the adhesive layer is revealed to complete adhesion between the chip and the substrate.

Then, a metal wire such as a gold wire is connected to the chip and a wire pad part of the substrate (wire bonding) in order to electrically connect the chip and the wire pad part or a lead part of a metal frame. Subsequently, sealing by transfer molding or potting sealing is conducted for the purpose of providing electrical and physical protection from the external environment. A semiconductor device is completed by mounting solder balls on the back side of the substrate or conducting solder plating on a non-sealed portion of a metal lead frame, so that electrical connection with the external environment is enabled.

The adhesive sheets disclosed in the patent documents described above enables so-called direct die-bonding and makes it possible to omit a step of coating an adhesive for adhering a die. In adhesives disclosed in the above patent documents, a low-molecular-weight energy-beam-curable compound is blended as an energy-beam-curable component. The energy-beam-curable compound is polymerized and cured by irradiating an energy beam before a step of picking up chips that is performed after dicing. As a result, adhesive strength of the adhesive layer decreases and the adhesive layer is easily separated from the base material. Further, after a die bonding where energy-beam curing and heat curing have already been completed, all components in the adhesive layer of the adhesive sheet are cured to strongly bond the chip and the substrate.

The patent document 4 discloses an adhesive composition comprising (A) an adhesive component, (B) a thermosetting adhesive component, and (C) a compound obtained by adding and condensing a silane coupling agent to a polysiloxane oligomer. A compound represented by the following formula is disclosed as the compound (C).

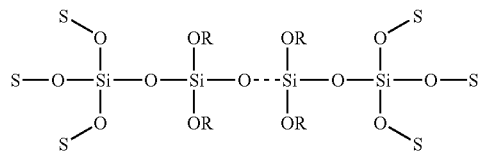

In the above formula, R is a methyl group or an ethyl group, and S is R or a group introduced by the silane coupling agent. Preferably at least two groups introduced by the silane coupling agent are included in one molecule of the compound (C).

In recent years, higher integration of semiconductor devices has been required. In a certain case, plural chips are stacked in a vertical direction within a certain limited height in order to achieving high integration in semiconductor devices. Consequently, it is required that chips constituting the semiconductor devices are further reduced in a thickness.

As the chips become thinner, a peeling strength (a strength necessary to peel an adhesive layer together with a chip from a base material of the adhesive sheet) in picking up chips has increasingly become an important factor which determines a manufacturing yield. If the value of this is high, the chips may be broken or chipped when being picked up, which reduces the manufacturing yield of the chips. The strength of wafers and chips when being conveyed is also a big factor which determines the manufacturing yield.

In summary, the high integration in semiconductor devices that has been recently required decreases the manufacturing yield of the semiconductor devices.

Patent document 1: JP-A-1990-32181
Patent document 2: JP-A-1996-239636
Patent document 3: JP-A-1998-8001
Patent document 4: JP-A-2000-17246

SUMMARY OF THE INVENTION

Thus, it is required to produce conforming products as the semiconductor devices with a high manufacturing yield and without breaking or chipping of the chips in their production, in semiconductor devices on which chips being reduced in a thickness is mounted.

The present invention has been made in light of the conventional arts described above, and an object thereof is to investigate an adhesive used for dicing and die-bonding of chips and meet the requirements described above.

The present inventors have made an intensive study with a purpose of solving such object and found that the object above can be solved by an adhesive sheet having an adhesive layer comprising an adhesive composition which contains a specific silicone compound component. Based on this finding, the present invention is accomplished.

Even in the case of chips being reduced in a thickness, by using the adhesive sheet, conforming products as the semiconductor devices can be produced with a high manufacturing yield and without breaking or chipping of the chips in the step of picking-up due to a small peeling strength in picking up the chips.

The present invention comprises the following essentials.

[1] An adhesive composition comprising:
(A) an acrylic polymer;
(B) an epoxy resin;
(C) a thermosetting agent; and
(D) a silicone compound,
wherein the silicone compound (D) is an organopolysiloxane having an aromatic ring-containing group (except for a reactive organic functional group) as a side chain and has a kinematic viscosity of 50 to 100,000 mm$^2$/s at 25° C.

[2] The adhesive composition according to [1], wherein the aromatic ring-containing group is an aralkyl group.

[3] The adhesive composition according to [1], wherein the thermosetting agent (C) is a thermosetting agent having a phenolic hydroxyl group and/or an amino group.

[4] The adhesive composition according to [2], wherein the thermosetting agent (C) is a thermosetting agent having a phenolic hydroxyl group and/or an amino group.

[5] An adhesive sheet comprising a base material and, formed thereon, an adhesive layer comprising:
(A) an acrylic polymer;
(B) an epoxy resin;
(C) a thermosetting agent; and
(D) a silicone compound,
wherein the silicone compound (D) is an organopolysiloxane having an aromatic ring-containing group (except for a reactive organic functional group) as a side chain and has a kinematic viscosity of 50 to 100,000 mm$^2$/s at 25° C.

[6] The adhesive sheet according to [5], wherein the aromatic ring-containing group is an aralkyl group.

[7] The adhesive sheet according to [5], wherein the thermosetting agent (C) is a thermosetting agent having a phenolic hydroxyl group and/or an amino group.

[8] The adhesive sheet according to [6], wherein the thermosetting agent (C) is a thermosetting agent having a phenolic hydroxyl group and/or an amino group.

[9] A production method of a semiconductor device, comprising:
a step of providing an adhesive sheet comprising a base material and, formed thereon, an adhesive layer comprising,
(A) an acrylic polymer;
(B) an epoxy resin;
(C) a thermosetting agent; and
(D) a silicone compound,
wherein the silicone compound (D) is an organopolysiloxane having an aromatic ring-containing group (except for a reactive organic functional group) as a side chain and has a kinematic viscosity of 50 to 100,000 mm$^2$/s at 25° C.,
a step of adhering a semiconductor wafer on the adhesive layer of the adhesive sheet,
a step of dicing the semiconductor wafer into chips,
a step of separating the chips from the base material of the adhesive sheet while transferring the adhesive layer to the back side of each of the chips,
a step of thermally bonding each of the separated chips on a die pad part through the adhesive layer transferred to the back side of each of the chips.

[10] The production method of a semiconductor device according to [9], wherein the aromatic ring-containing group is an aralkyl group.

[11] The production method of a semiconductor device according to [9], wherein the thermosetting agent (C) is a thermosetting agent having a phenolic hydroxyl group and/or an amino group.

[12] The production method of a semiconductor device according to [10], wherein the thermosetting agent (C) is a thermosetting agent having a phenolic hydroxyl group and/or an amino group.

In a production of a semiconductor device on which chips being reduced in a thickness is mounted, a strength necessary for pick-up in a pick-up step is reduced due to the adhesive sheet of the present invention, whereby such chips are much less likely to be broken or chipped. Hence, it is possible to produce conforming products as semiconductor devices with a high manufacturing yield.

Further, the present invention provides a production method of a semiconductor device using the adhesive sheet.

BRIEF DESCRIPTION OF THE DRAWING

FIG. 1 illustrates a situation in which the central portion of each of the wires is pulled up in the direction perpendicular to a surface of the chip in a Wire Pulling Test.

DETAILED DESCRIPTION OF THE INVENTION

The present invention shall be explained in detail below.

[Adhesive Composition of the Present Invention]

The adhesive composition according to the present invention comprises an acrylic polymer (A), an epoxy resin (B), a thermosetting agent (C) and a specific silicone compound (D) as essential components. The adhesive composition of the present invention may contain other components in order to improve a variety of the physical properties if necessary. The each component shall specifically be explained below.

<(A) Acrylic Polymer>

As the acrylic polymer (A), conventionally known acrylic polymers can be used. The acrylic polymer (A) has a weight average molecular weight of preferably 10,000 to 2,000,000, more preferably 100,000 to 1,500,000. If the acrylic polymer has a too low weight average molecular weight, the adhesive strength with the base material is high, and inferior picking-up of chips may be caused. On the other hand, if it exceeds 2,000,000, the adhesive layer can not follow irregularities on the substrate in a certain case, which is the cause of bringing about voids. In this specification, the term "weight average molecular weight" refers to a weight average molecular weight in terms of a molecular weight of standard polystyrene measured by GPC.

The acrylic polymer (A) has a glass transition temperature falling in a range of preferably −60° C. to 20° C., more preferably −50° C. to 10° C. and particularly preferably −40° C. to 5° C. If the glass transition temperature is too low, a peeling strength between the adhesive layer and the base material is increased, and inferior picking-up cannot be ameliorated in a certain case. On the other hand, if it is too high, the adhesive strength for fixing a wafer is likely to be unsatisfactory.

Examples of monomers forming structural units of the acrylic polymer (A) include (meth)acrylic ester monomer or derivatives thereof.

Mention may be made of alkyl(meth)acrylates in which the alkyl group has 1 to 18 carbon atoms and the like as the (meth)acrylic ester monomer. Examples of such compounds include methyl(meth)acrylate, ethyl(meth)acrylate, propyl(meth)acrylate, butyl(meth)acrylate and 2-ethylhexyl (meth)acrylate.

Mention may be made of (meth)acrylates having a cyclic skeleton as the derivative of the (meth)acrylic ester monomer. Examples of such compounds include cycloalkyl (meth)acrylate, benzyl (meth)acrylate, isobornyl acrylate, dicyclopentanyl acrylate, dicyclopentenyl acrylate, dicyclopentenyl oxyethyl acrylate, imido acrylate, glycidyl methacrylate and glycidyl acrylate.

Other examples of the derivative include (meth)acrylates which have a hydroxyl group such as 2-hydroxyethyl acrylate, 2-hydroxyethyl methacrylate, 2-hydroxypropyl acrylate and 2-hydroxypropyl methacrylate.

Further, the acrylic polymer (A) may be copolymerized with acrylic acid, methacrylic acid, itaconic acid, vinyl acetate, acrylonitrile, styrene and the like.

Among the exemplified monomers, 2-hydroxyethyl acrylate, 2-hydroxyethyl methacrylate, 2-hydroxypropyl acrylate and 2-hydroxypropyl methacrylate which have a hydroxyl group are preferred because they shows good compatibility with an epoxy resin (B).

The acrylic polymer (A) can be used alone or in combination of two or more kinds thereof.

<(B) Epoxy Resin>

As the epoxy resin (B), various epoxy resins conventionally known can be used alone or in combination of two or more kinds thereof. Examples of the conventionally known epoxy resin include epoxy compounds having two or more functional groups in a molecule such as bisphenol A diglycidyl ether and hydrogenated compounds thereof, ortho-cresol novolak type epoxy resins (the following Formula (1)) dicyclopentadiene type epoxy resins (the following Formula (2)), biphenyl type epoxy resins (the following Formulae (3) and (4)) and multifunctional type epoxy resin (the following Formula (5)). The epoxy resin (B) preferably contains an aromatic ring in its main skeleton.

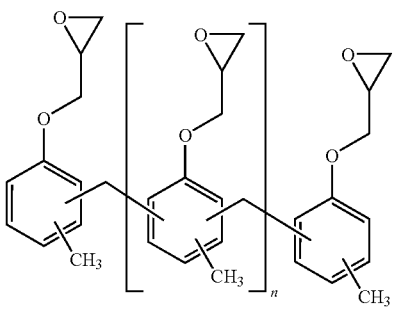

(1)

(wherein n is an integer of 0 or more),

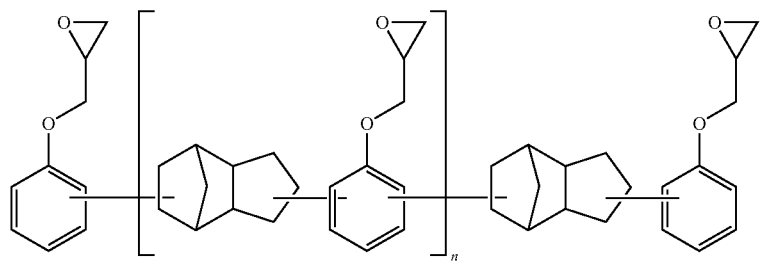

(2)

(wherein n is an integer of 0 or more),

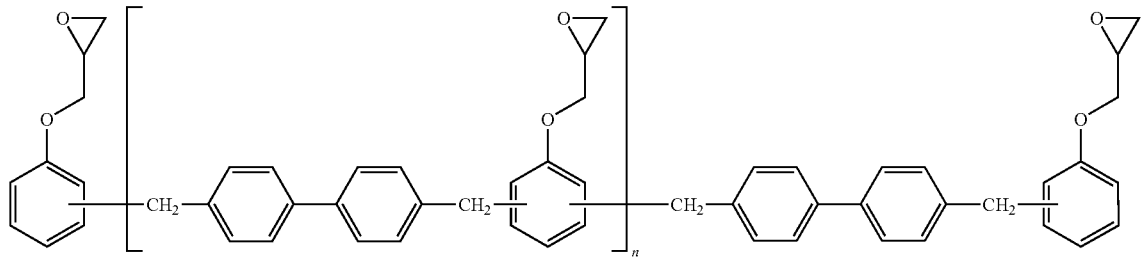

(3)

(wherein n is an integer of 0 or more),

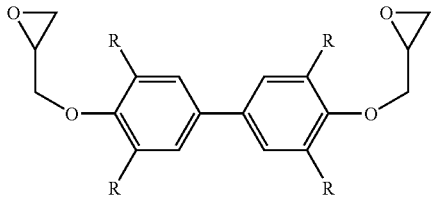

(wherein R is a hydrogen atom or a methyl group),

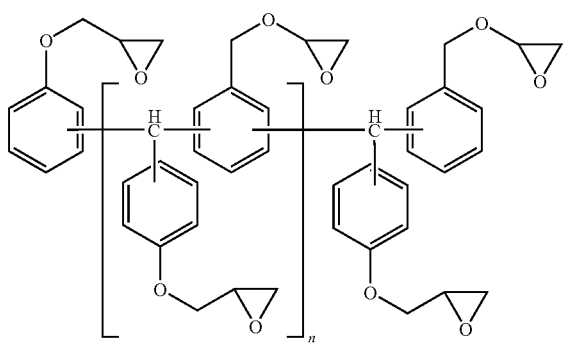

(wherein n is an integer of 0 or more).

<(C) Thermosetting Agent>

The thermosetting agent (C) acts as a thermosetting agent of the epoxy resin (B), so that the thermosetting reaction rate of the adhesive layer comprising the adhesive composition can be adjusted and physical properties such as an elastic modulus of the thermoset adhesive layer can be adjusted so as to be within a preferable range.

Examples of the preferred thermosetting agent include compounds having two or more functional groups in a molecule which can react with an epoxy group, and examples of the functional group include a phenolic hydroxyl group, an alcoholic hydroxyl group, an amino group, a carboxyl group and an acid anhydride and the like. Among the above, a phenolic hydroxyl group, an amino group and an acid anhydride are preferable, and a phenolic hydroxyl group and an amino group are more preferable from the viewpoint of thermosetting property.

The specific examples of the thermosetting agents include phenolic thermosetting agents such as a novolak type phenol resin (the following Formula (6)), a dicyclopentadiene type phenol resin (the following Formula (7)) and a multifunctional type phenol resin (the following Formula (8)) and amine thermosetting agents such as DICY (dicyandiamide). The above thermosetting agents can be used alone or in a mixture of two or more kinds thereof.

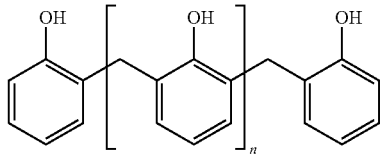

(wherein n is an integer of 0 or more),

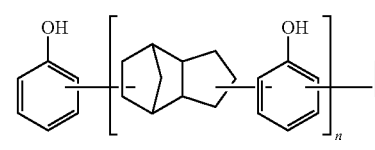

(wherein n is an integer of 0 or more), (8)

(wherein n is an integer of 0 or more).

The thermosetting agent (C) preferably contains an aromatic ring in its main skeleton.

The total content by weight of the epoxy resin (B) and the thermosetting agent (C) with respect to 100 parts by weight of the acrylic polymer (A) is preferably 1 to 1500 parts by weight, more preferably 3 to 1000 parts by weight. In the case where the total content is less than 1 part by weight, sufficient adhesiveness cannot be achieved and the advantages of the present invention are not sufficiently provided in a certain case. On the other hand, in the case where the total content exceeds 1500 parts by weight, it may be difficult to process the adhesive composition into a sheet form.

Further, the usage of the thermosetting agent (C) is preferably 0.1 to 500 parts by weight, more preferably 1 to 200 parts by weight with respect to 100 parts by weight of the epoxy resin (B). In the case where the amount of the thermosetting agent (C) used is much smaller than that of the epoxy resin (B), the adhesiveness is not obtained in a certain case due to poor thermosetting, and if it is excessive, the moisture absorptivity increases to reduce a reliability of the semiconductor device in a certain case.

<(D) Silicone Compound>

The adhesive composition of the present invention is characterized in that it comprises a specific silicone compound (D), whereby a strength (a picking-up strength) necessary for picking up chips can be reduced in a step of picking up the chips subjected to singulation (dicing). As a result, individual chips can be picked up without being broken or chipped.

The silicone compound (D) is an organopolysiloxane having an aromatic ring-containing group (except for a reactive organic functional group) as a side chain and has a kinematic viscosity of 50 to 100,000 mm$^2$/s at 25° C.

Polysiloxane is a compound, in which a plurality of unit structures represented by —Si(X)$_2$—O— are connected (wherein X is a side chain). The number of the unit structures is not particularly limited as long as the kinematic viscosity described above falls within the aforementioned range, but is normally three or more.

The silicone compound (D) reduces a picking-up strength due to a siloxane moiety of organopolysiloxane. The silicone compound (D) also has high lipid solubility due to the aromatic ring-containing group included as its side chain, thereby having high compatibility with the other components in the adhesive composition. Furthermore, the epoxy resin (B) and the thermosetting agent (C) in the adhesive composition often have an aromatic ring as a constituent. In such case, the compatibility of the silicone compound (D) with the epoxy resin (B) and the thermosetting agent (C) is further increased due to the aromatic ring-containing group of the silicone compound (D). By adding the silicone compound (D) having such high compatibility with the other components in the adhesive composition, chips can be effectively prevented from being broken or chipped in a picking-up step. In addition, the silicone compound (D) does not easily ooze out of the adhesive layer or is not easily released as outgas in a heating step such as a die bonding step.

The aromatic ring-containing group is an aromatic ring-containing group other than a reactive organic functional group. Examples of the aromatic ring-containing group include a phenyl group and an aralkyl group. The aralkyl group mentioned herein is an aralkyl group whose alkyl moiety is straight or branched and has preferably 1 to 5, more preferably 1 to 3 carbon atoms and whose aryl moiety has preferably 6 to 10, more preferably 6 carbon atoms. Preferable examples of the aralkyl group include a benzyl group, a phenylethyl group, a phenylpropyl group and a phenylisopropyl group.

An aralkyl group is preferable as the aromatic ring-containing group. An aromatic ring has a high degree of freedom in the case where, like in the case of an aralkyl group, an aromatic ring binds to a silicon atom in a polysiloxane backbone via an alkyl moiety, compared with the case where an aromatic ring directly binds to the silicon atom. When the epoxy resin (B), the thermosetting agent (C) and the like have an aromatic ring, the compatibility is further increased because the aromatic ring of the silicone compound (D) takes an optimum configuration with respect to the aromatic ring of the epoxy resin (B), the thermosetting agent (C) and the like.

The reactive organic functional group is a functional group having an electron-donating group or an electron-withdrawing group. Specific examples of the reactive organic functional group include a hydroxyalkyl group, a carboxyalkyl group, an aminoalkyl group, an alkyl group containing an epoxy group, an alkyl group containing an alicyclic epoxy group, an alkyl group containing a methacrylic group, an alkyl group containing a phenolic group and a mercaptoalkyl group.

The percentage of the aromatic ring-containing group in side chains is normally 5 to 100 mole percent, preferably 10 to 90 mole percent, more preferably 15 to 80 mole percent. In the case where the percentage of the aromatic ring-containing group in side chains is less than 5 mole percent, the compatibility with the adhesive layer is insufficient and outgas or the like may be released in a die bonding step or the like. Examples of the side chains include alkyl groups such as a methyl group, an ethyl group, a propyl group, an isopropyl group or the like other than the aromatic ring-containing group.

On the other hand, the kinematic viscosity of the silicone compound (D) at 25° C. is 50 to 100,000 mm$^2$/s, preferably 200 to 10,000 mm$^2$/s, more preferably 500 to 3,000 mm$^2$/s.

In the case where the kinematic viscosity is less than 50 mm$^2$/s at 25° C., the silicone compound (D) oozes out of the adhesive layer in a die bonding step. In the case where the kinematic viscosity is more than 100,000 mm$^2$/s, the silicone compound (D) and other components are phase-separated in the adhesive layer, so that a uniform picking-up strength cannot be achieved.

The kinematic viscosity referred to in this specification is a value measured with an Ubbelohde viscometer in accordance with JIS K2283.

Although an adhesive composition containing PDMS (polydimethylsiloxane) which is the most commonly used silicone compound provides an advantage of decreasing a picking-up strength, it causes a trouble in a wire bonding step that is performed after a die bonding step. This reason is thought that, after a step that needs heating such as a thermosetting step during a die bonding or a wire bonding step, low-molecular-weight siloxane oozes out of the adhesive layer or is released as outgas due to the bad compatibility of PDMS with an epoxy resin, which contaminates a wire pad part where a wire composed of gold or aluminum is connected. As a result, stable connection strength cannot be achieved.

On the other hand, since the silicone compound (D) used in the present invention has the aromatic ring-containing group at side chains, the silicone compound (D) has a high compatibility with the epoxy resin (B) or a phenol resin used as the thermosetting agent (C), whereby the silicone compound (D) is thought not to easily ooze out of the adhesive layer. Hence, the silicone compound (D) is not easily ooze out of the adhesive layer and is not easily released as outgas. Thus, when the adhesive composition of the present invention is used, the wire pad part is not contaminated during the die bonding step of the chips, which achieves stable wire bonding quality.

The silicone compound (D) can be manufactured by a well-known method and is commercially available. An example of an organopolysiloxane; having an aralkyl group at its side chain is "XF42-334 available from Momentive Performance Materials Japan LLC". An example of an organopolysiloxane having a phenylisopropyl group at its side chain is "X-22-1877 available from Shin-Etsu Chemical Co., Ltd".

These silicone compounds having an aromatic ring-containing group at its side chain can be used alone or in combination of two or more kinds thereof.

The content of the silicone compound (D) is preferably 0.001 to 5 parts by weight, more preferably 0.05 to 1 part by weight with respect to the weight of the adhesive layer. As described in detail below, the adhesive layer is obtained, for example, by coating an adhesive composition on a substrate and drying it. To enable easy coating of the adhesive composition on a substrate, the adhesive composition normally contains a solvent. Accordingly, the weight of the adhesive layer is calculated by subtracting the weight of volatile components such as a solvent from the total weight of the adhesive composition.

In the case where the content of the silicone compound (D) is 0.001 parts by weight or less, a pick-up force is sometimes not decreased sufficiently. In the case where the content is 5 parts by weight or more, an adhesive force of the adhesive layer to chips decreases and the reliability of semiconductor devices may decrease.

As described above, the adhesive composition of the present invention comprises the acrylic polymer (A), the epoxy resin (B), the thermosetting agent (C) and the silicone compound (D) having a specific side chain. The silicone compound (D) can reduce a picking-up strength, and does not easily ooze out of an adhesive layer or is not easily released as outgas. Therefore, when an adhesive sheet having an adhesive layer composed of the adhesive composition of the present invention is used, a wire can be stably connected to a chip without contaminating a wire pad part disposed at the circumference of a bonding surface during a wire bonding step that is performed after die bonding of the chip. Consequently, conforming products as semiconductor devices can be produced with a high manufacturing yield. The adhesive composition of the present invention may further comprise the following components in order to improve a variety of the physical properties if necessary.

<(E) Thermosetting Accelerating Agent>

The thermosetting accelerating agent (E) is used in order to adjust a thermosetting speed of the adhesive composition. Examples of the preferred thermosetting accelerating agent include compounds which can accelerate reaction of an epoxy group with a phenolic hydroxy group, amino group and the like. Specifically, the examples include tertiary amines such as triethylenediamine, benzyldimethylamine, triethanolamine, dimethylaminoethanol and tris(dimethylaminomethyl)phenol; imidazoles such as 2-methylimidazole, 2-phenylimidazole and 2-phenyl-4-methylimidazole; organic phosphines such as tributylphosphine, diphenylphosphine and triphenylphosphine; and tetraphenylboron salts such as tetraphenylphosphonium tetraphenylborate and triphenylphosphine tetraphenylborate and the like.

They can be used alone or in a mixture of two or more kinds thereof.

The thermosetting accelerating agent (E) is preferably contained in an amount of 0.01 to 100 parts by weight, more preferably 0.1 to 50 parts by weight and still more preferably 1 to 30 parts by weight with respect to 100 parts by weight of the epoxy resin (B) from the viewpoint of thermosetting property.

<(F) Coupling Agent>

A coupling agent (F) is used in order to enhance an adhesion of the adhesive composition to an adherend. Use of the coupling agent makes it possible to improve a water resistance of a cured product obtained by thermosetting the adhesive composition without damaging a heat resistance of the cured product. Compounds having groups which react with functional groups present in the (A) component, (B) component and (C) component and the like are preferably used as the coupling agent (F).

The coupling agent (F) is preferably a silane coupling agent. Examples of the above coupling agent include γ-glycidoxypropyltrimethoxysilane, γ-glycidoxypropylmethyldiethoxysilane, β-(3,4-epoxycyclohexyl)ethyltrimethoxysilane, γ-(methacrylopropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane and imidazolesilane and the like.

These coupling agents improve adhesion of the adhesive layer and a chip or an organic substrate after thermosetting because they have at least two kinds of functional groups in a molecule.

They can be used alone or in a mixture of two or more kinds thereof. When using the coupling agent (F), they are used in a proportion of usually 0.1 to 20 parts by weight, preferably 0.5 to 15 parts by weight and more preferably 1 to 10 parts by weight with respect to 100 parts by weight of the epoxy resin (B). When it is less than 0.1 part by weight, the effects as a coupling agent might not be obtained, and when it exceeds 20 parts by weight, the coupling agent might be released as outgas.

<(G) Cross-Linking Agent>

A cross-linking agent (G) can be added in order to control an initial adhesive strength and a cohesion of the adhesive composition of the present invention. Examples of the cross-linking agent (G) include organic polyvalent isocyanate compounds and organic polyvalent imine compounds.

Examples of the organic polyvalent isocyanate compounds include aromatic polyvalent isocyanate compounds, aliphatic polyvalent isocyanate compounds and alicyclic polyvalent isocyanate compounds.

More specific examples of the organic polyvalent isocyanate compounds include 2,4-tolylenediisocyanate, 2,6-tolylenediisocyanate, 1,3-xylylenediisocyanate, 1,4-xylylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2,4'-diisocyanate and lysineisocyanate. Further, the organic polyvalent isocyanate compounds include trimers of the above polyvalent isocyanate compounds and end isocyanate urethane prepolymers obtained by reacting the above polyvalent isocyanate compounds with polyol compounds and the like.

Specific examples of the organic polyvalent imine compounds include N,N'-diphenylmethane-4,4'-bis(1-aziridinecarboxyamide), trimethylolpropane-tri-b-aziridinyl propionate, tetramethylolmethane-tri-b-aziridinyl propionate and N,N'-toluene-2,4-bis(1-aziridinecarboxyamide)triethylenemelamine.

They can be used alone or in a mixture of two or more kinds thereof.

The cross-linking agent (G) is usually used in a proportion of 0.01 to 10 parts by weight, preferably 0.1 to 5 parts by weight and more preferably 0.5 to 3 parts by weight with respect to 100 parts by weight of the acrylic polymer (A) from the viewpoint of reactivity.

<(H) Inorganic Filler>

Blending of the adhesive composition with an inorganic filler (H) makes it possible to control its thermal expansion coefficient, and optimization of a thermal expansion coefficient of the adhesive layer after thermal cured to a chip and an organic substrate makes it possible to enhance a heat resistance of the semiconductor device. Further, a moisture absorptivity of the adhesive layer after thermal cured can be reduced.

Examples of the preferred inorganic filler include powders of silica, alumina, talc, calcium carbonate, titan white, red iron oxide, silicon carbide, boron nitride and the like, beads obtained by sphering the above compounds, monocrystalline fibers, glass fibers and the like.

In the present invention, among them, silica powder and alumina powder are preferably used.

They can be used alone or in a mixture of two or more kinds thereof.

The amount of the inorganic filler (H) can be controlled in a range of usually 0 to 80% by weight based on the whole adhesive composition.

<(I) Energy Beam-Polymerizable Compound>

The adhesive composition of the present invention may be blended with an energy beam-polymerizable compound (I). The adhesive strength of the adhesive layer can be reduced by curing the adhesive layer blended with the energy beam-polymerizable compound (I) by irradiation with an energy beam and thus interlayer separation between the base material and the adhesive layer during picking-up step can readily be carried out.

The energy beam-polymerizable compound (I) is a compound which is polymerized and cured by irradiation with an energy beam such as a UV (Ultra Violet) ray and an electron beam.

Specific examples of the energy beam-polymerizable compound (I) include acrylate base compounds such as dicyclopentadiene dimethoxy diacrylate, trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligo ester acrylate, urethane acrylate oligomers, epoxy-modified acrylate, polyether acrylate and itaconic acid oligomer.

These compounds have at least one polymerizable double bond in a molecule, and they have a weight average molecular weight of usually 100 to 30,000, preferably 300 to about 10,000.

They can be used alone or in combination of two or more kinds thereof.

When using the energy beam-polymerizable compound (I), a content of the energy beam-polymerizable compound (I) in the adhesive composition is usually 1 to 400 parts by weight, preferably 3 to 300 parts by weight and more preferably 10 to 200 parts by weight with respect to 100 parts by weight of the acrylic polymer (A). If it exceeds 400 parts by weight, the adhesion of the adhesive layer to an organic substrate and a lead frame is reduced in a certain case.

<(J) Photopolymerization Initiator>

In using the adhesive composition blended with the energy beam-polymerizable compound (I), it is irradiated with a UV ray as an energy beam in a certain case. In this case, addition of a photopolymerization initiator (J) to the above composition makes it possible to reduce the polymerization and curing time and the beam irradiation dose.

Specific examples of the photopolymerization initiator (J) include benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxanthone, α-hydroxycyclohexyl phenyl ketone, benzyl diphenyl sulfide, tetramethylthiuram monosulfide, azobisisobutyronitrile, diacetyl and β-chloroanthraquinone and the like.

The photopolymerization initiator (J) can be used alone or in combination of two or more kinds thereof.

A blending proportion of the photopolymerization initiator (J) has to be determined, to be theoretical, based on an amount of an unsaturated bond present in the adhesive, a reactivity thereof and a reactivity of the photopolymerization initiator used, but it is not necessarily easy in a complicated mixture system.

When using the photopolymerization initiator (J), a content of the photopolymerization initiator (J) in the adhesive composition is, as a general guideline, preferably 0.1 to 10 parts by weight, more preferably 1 to 5 parts by weight with respect to 100 parts by weight of the energy beam-polymerizable compound (I). If it is less than 0.1 part by weight, the satisfactory picking-up property is not obtained due to lack of photopolymerization in a certain case. If it exceeds 10 parts by weight, residues which do not contribute to the photopolymerization are produced, and a curing property of the adhesive layer is unsatisfactory in a certain case.

<Other Components>

The adhesive composition of the present invention may be blended, if necessary, with various additives in addition to the components described above.

For example, a flexible component can be added in order to maintain the flexibility of cured product obtained by thermosetting of the adhesive layer. The flexible component is a component which has flexibility at room temperature and under heating, and what is not substantially cured by heating or irradiating with an energy beam is selected. The flexible component may be a polymer comprising a thermoplastic resin or an elastomer or may be a graft component of a polymer or a block component of a polymer. Further, the flexible component may be a modified resin which is modified in advance with an epoxy resin.

Further, mention may be made of a plasticizer, an antistatic agent, an antioxidant, a pigment, a dye and the like as the various additives for the adhesive composition of the present invention.

The adhesive composition comprising the components described above has a pressure sensitiveness and a thermosetting property, and the composition in a non-cured state has a function of temporarily holding various adherents. It can provide finally a cured product having a high impact resistance through thermosetting, and in addition thereto, it is excellent in a balance between a shearing strength and a peeling strength and can maintain a satisfactory adhesive property even under a severe hot and humid condition.

The adhesive composition of the present invention reduces the picking-up strength and makes it possible to produce conforming products as chips with a high manufacturing yield. In addition, by the adhesive composition, a wire can be stably connected to a chip without contaminating a wire pad part disposed at the circumference of a bonding surface during the wire bonding step that is performed after the die bonding of the chips. Consequently, conforming products as semiconductor devices can be produced with a high manufacturing yield.

The adhesive composition according to the present invention is obtained by mixing the respective components described above in suitable proportions. In mixing, the above components may be diluted in advance by a solvent or the solvent may be added in mixing.

[Adhesive Sheet of the Present Invention]

The adhesive sheet according to the present invention comprises a base material and, formed thereon, an adhesive layer comprising the adhesive composition described above. The adhesive sheet can have all forms such as a tape form, a label form and the like.

Used as the base material for the adhesive sheet are, for example, transparent films such as a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene vinyl acetate film, an ionomer resin film, an ethylene (meth)acrylic acid copolymer film, an ethylene (meth)acrylic ester copolymer film, a polystyrene film, a polycarbonate film, a polyimide film, a fluororesin film and the like.

Also, cross-linked films thereof may be used as well. Further, laminated films thereof may be used. In addition to the transparent films described above, opaque films obtained by coloring the above films and the like can be used.

The adhesive sheet according to the present invention is adhered on various adherends, and after the adherends are subjected to required processing, the adhesive layer is separated from the base material while being transferred to the adherend. That is, the adhesive sheet according to the present invention is used for a process including a step of transferring the adhesive layer from the base material onto the adherend.

Accordingly, a face of the base material brought into contact with the adhesive layer has a surface tension of preferably 40 mN/m or less, more preferably 37 mN/m or less and particularly preferably 35 mN/m or less. Further, before the picking-up step, the surface tension needs to be 5 mN/m or more in order that the adhesive layer is not peeled off from the chip or the base material. The base material having such a low surface tension can be obtained by suitably selecting materials, and it can be obtained as well by subjecting the surface of the base material to release treatment by coating a release agent on it.

Release agents of an alkid base, a silicone base, a fluorine base, an unsaturated polyester base, a polyolefin base, a wax base and the like are used as the release agent used for the release treatment of the base material. In particular, the release agents of an alkid base, a silicone base and a fluorine base are preferred since they have a heat resistance.

When the silicone base release agent is used, the silicone base release agent coated on the base material attaches to the adhesive layer in a certain case and as a result, the advantages of the present invention may not be provided. Hence, a used amount of the silicone base release agent should be kept to minimum necessary amount.

In order to subject the surface of the base material to release treatment with the release agent, the release agent without dissolving in a solvent or the release agent which is diluted or emulsified with a solvent is applied by means of a gravure coater, a Mayor bar coater, an air knife coater, a roll coater and the like and cured at room temperature or by heating or by irradiating with an electron beam, or a laminate of the base material layer and the release agent layer is formed by wet lamination, dry lamination, hot melt lamination, melt extrusion lamination, coextrusion working and the like.

The base material has a film thickness of usually about 10 to 500 µm, preferably about 15 to 300 µm and particularly preferably about 20 to 250 µm.

The adhesive layer has a thickness of usually about 1 to 500 µm, preferably about 5 to 300 µm and particularly preferably about 5 to 150 µm.

A production method of the adhesive sheet of the present invention shall not specifically be restricted and the adhesive sheet can be produced by publicly known method. For example, it may be produced by coating the adhesive composition constituting the adhesive layer on a base material and drying it or may be produced by providing the adhesive layer on a release film and transferring it onto the base material. A release film may be laminated on an upper face of the adhesive layer in order to protect the adhesive layer before using the adhesive sheet Furthermore, a pressure sensitive adhesive layer may be separately provided at an outer circumferential part of the surface of the adhesive layer in order to fix jigs such as a ring frame.

[Production Method of a Semiconductor Device]

A method for utilizing the adhesive sheet according to the present invention will be described in the context of an example where the adhesive sheet is applied to production of a semiconductor device.

In the production method of a semiconductor device according to the present invention, the adhesive sheet according to the present invention is fixed on a dicing equipment with a ring framer and one face of a semiconductor wafer is placed on the adhesive layer of the adhesive sheet and slightly pressed to fix the semiconductor wafer.

Then, the semiconductor wafer described above is cut by means of a cutting means such as a dicing blade to obtain chips. In this case, the cut depth is a depth determined by adding the total of a thickness of the semiconductor wafer and a thickness of the adhesive layer and an abraded part of the dicing blade.

Then, expanding of the adhesive sheet carried out if necessary enlarges an interval between the chips to make picking-up of the chips ready to be carried out. This is because the expanding causes deviation between the adhesive layer and the base material, whereby an adhesive strength between the adhesive layer and the base material is reduced, so that the picking-up property of the chips is enhanced. In the case where the adhesive layer contains the energy-beam-polymerizable compound (I), the picking-up strength can be reduced by irradiating with an energy beam after dicing, or a wafer-fixing function and a die-bonding function can be exerted by irradiating with an energy beam before the dicing step.

Picking-up of the chips carried out in the manner described above makes it possible to separate the cut adhesive layer from the base material while being transferred to the back side of the chip.

As aforementioned, the adhesive composition of the present invention has a low picking-up strength because it comprises the silicone compound (D), whereby conforming products as chips can be produced with a high manufacturing yield and without breaking or chipping of the chips.

Then, the chip is mounted on a die pad part of a substrate through the adhesive layer. The die pad part is heated before mounting the chip or immediately after mounting. The heating temperature is usually 80 to 200° C., preferably 100 to 180° C. The heating time is usually 0.1 seconds to 5 minutes, preferably 0.5 seconds to 3 minutes, and the mounting pressure is usually 1 kPa to 200 MPa.

After the chip is mounted on the die pad part, it may be further heated if necessary. In this case, the heating condition falls in the range of the heating temperature described above, and the heating time is usually 1 to 180 minutes, preferably 10 to 120 minutes.

At this point, the chip may be temporarily adhered without heating after mounting, and the adhesive layer may be cured by using the heating in a resin sealing conducted in the later step.

The semiconductor device is produced by passing through these steps. The adhesive layer is cured by passing through the above steps, and the IC chip can be firmly adhered onto the die pad part. The adhesive layer is fluidized under a die bonding condition, and therefore it is sufficiently embedded into irregularities of the die pad part and can prevent voids from being produced.

That is, in the mounted product obtained, the adhesive which is a firmly adhering means for the chip is cured and is sufficiently embedded into the irregularities of the die pad part, and therefore the satisfactory reliability of semiconductor device and board mounting property are achieved even under severe conditions.

Wire-bonding may be further performed after the chip is adhered onto the substrate in the above manner. As aforementioned, since the silicone compound (D) used in the present invention has an aromatic ring-containing group at its side chain, the silicone compound (D) has a high compatibility with an epoxy resin, and thus the silicone compound (D) is not easily oozed out of the adhesive layer or is not easily released as outgas. Thus, the wire pad part is not contaminated during the wire bonding step of the chips, which achieves stable wire bonding quality.

The adhesive composition and the adhesive sheet according to the present invention can be used as well for adhering semiconductor compounds, glass, ceramics, metals and the like in addition to the applications described above.

EXAMPLES

Hereinbelow, the present invention shall be explained with reference to examples, but the present invention shall not be restricted to these examples. In the following examples and comparative examples, "Picking-up Load Measurement", "Picking-up test" and "Wire Pulling Test" were conducted as follows.

[Picking-Up Load Measurement]

Each of adhesive sheets of the examples and comparative examples was adhered on the back side of a 6-inch wafer (thickness: 350 µm, backside: #2000 ground), and the wafer was fixed to a ring frame (2-6-1 available from DISCO Corporation). The wafer was subjected to full cutting into 5 mm square chips using a dicing machine (DFD651 available from DISCO Corporation; dicing blade: 27HECC available from DISCO Corporation) under the following conditions. The feeding speed of the blade, the number of rotations and the cutting depth into the adhesive sheets were 50 mm/sec, 30,000 rpm and 50 µm, respectively.

The adhesive sheet was expanded over the entirety thereof by 12 mm along the inner edge of the ring frame in the direction parallel to the surface on which the wafer was adhered. Each of the singulated chips was pushed using a push-pull gauge (CPU gauge available from AIKOH ENGINEERING CO., LTD.) from its back side to measure a strength necessary for the chip to be peeled off while the adhesive layer remained adhered to the chip. Thirty chips were measured and the average was calculated.

[Picking-Up Test]

Each of adhesive sheets of the examples and comparative examples was adhered on the back side of an 8-inch wafer (thickness: 75 µm, back: dry-polished), and the wafer was fixed to a ring frame (2-8-1 available from DISCO Corporation). The wafer was singulated (chipped) by subjecting it to full cutting into 8 mm square chips using a dicing machine (DFD651 available from DISCO Corporation; dicing blade: 27HECC available from DISCO Corporation) under the following conditions. The feeding speed of the blade, the number of rotations and the cutting depth into the adhesive sheets were 50 mm/sec, 30,000 rpm and 50 µm, respectively.

Each of the singulated chips was pushed up with a push-up jig (four-plus-one pin) and a hollow collet using a fully automatic die bonder (BESTEM-DOII available from Canon Machinery Inc.) under the following conditions: a push-up distance of 600 µm for all pins and a push-up speed of 10 mm/sec. When 20 of the chips for each examples and comparative examples were pushed up, the number of the chips that could be picked up and mounted on a substrate without any troubles such as machine halt caused by unsuccessful picking-up of the chips or damage to the chips was counted.

[Wire Pulling Test]

Each of adhesive sheets of the examples and comparative examples was adhered using a tape mounter (Adwill RAD2500 available from LINTEC Corporation) on a ground surface of a #2000 ground TEG wafer (PHASE 0 (polyimide-applied; opening of an aluminum pad: 80 µm square; diameter: 150 mm; thickness: 350 µm) available from Hitachi ULSI Systems Co., Ltd.), and the wafer was fixed at a ring frame for wafer dicing. The wafer was then diced into chips of 8.52 mm square size using a dicing machine (DFD651 available from DISCO Corporation; dicing blade: 27HECC available from DISCO Corporation) under the following conditions. The feeding speed of the blade, the number of rotation and the cutting depth into the adhesive sheets were 50 mm/sec, 40,000 rpm and 50 µm, respectively.

Each of the chips was die-bonded with a fully automatic die bonder machine (BESTEM-DOII available from Canon Machinery Inc.) on a substrate (available from Hitachi ULSI Systems Co., Ltd., bonding pad composed of Ni/Au alloy with 0.4 µm) using a BT resin (CCL-HL832HS available from MITSUBISHI GAS CHEMICAL COMPANY, INC.) as an insulating adhesive layer. The substrate was a copper-foil-coated multilayer on whose copper foil a circuit pattern was formed, and a solder resist (PSR4000 AUS303 available from TAIYO INK MFG. CO., LTD.) was on the circuit pattern.

The adhesive layer of the adhesive sheet adhered to the chips which were die-bonded on the substrate was thermoset by heating in an oven at 120° C. for 1 hour and then at 140° C. for 1 hour. After that, each of the chips was connected to the substrate by bonding each of the chips and the substrate with 236 wires using a wire bonder (UTC-470 available from SHINKAWA LTD. (φ25 µm Au wire; 486FC-2052-R34 capillary available from K&S Co., Ltd.)) under the following conditions: 180° C., 10 msec, load 25 gf, output of ultrasonic waves 30 PLS. For twenty of the wires, the central portion of each of the wires was pulled up in the direction perpendicular to a surface of the chip to measure tensile strength at the moment when the wire was broken (wire pulling test). In addition, the number of wires that satisfied the conditions where the connecting portion on the chip side was not peeled off, the wire portion was broken and the tensile strength at that moment was 7.0 gf or more was counted, FIG. 1 illustrates the above-described situation in which "the central portion of each of the wires was pulled up in the direction perpendicular to a surface of the chip".

Furthermore, the components constituting the adhesive composition of the adhesive sheets of examples and comparative examples are as follows.

(A): Acrylic polymer: available from Nippon Synthetic Chemical Industry Co., Ltd. COPONYL N-2359-6 (Mw: about 300000, Tg: −28° C.)

(B-1) Liquid epoxy resin: Bisphenol A type epoxy resin product containing 20 phr acrylic particle (NIPPON SHOKUBAI CO., Ltd.: EPOSET BPA328, epoxy equivalent: 235 g/eq)

(B-2) Solid epoxy resin: Bisphenol A type epoxy resin (DIC corporation: EPICRON 1050, epoxy equivalent: 850 g/eq)

(B-3) Solid epoxy resin: DCPD (dicyclopentadiene) type epoxy resin (DIC corporation: EPICRON HP-7200HH, epoxy equivalent: 278 g/eq (C) Thermosetting agent: Novolak type phenol resin (Showa Highpolymer Co., Ltd.: Shonol BRG-556, phenolic hydroxyl group equivalent: 104 g/eq)

(D-1) Side chain alkyl and aralkyl-modified silicone compound (organopolysiloxane having an aralkyl group at its side chain, Momentive Performance Materials Japan LLC: XF42-334, kinematic viscosity: 1300 mm$^2$/s)

(D-2) Non-modified silicone compound (polydimethylsiloxane, Momentive Performance Materials Japan LLC: TSF-451-1000, kinematic viscosity: 1000 mm$^2$/s)

(E) Thermosetting accelerating agent: 2-phenyl-4-methyl-5-hydroxymethylimidazole (Shikoku Chemicals Corporation: CURESOL 2PHZ-PW)

(F) Silane coupling agent (Mitsubishi Chemical Corporation: MKC Silicate MSEP2)

(H) Silica filler (Admatechs Company Limited: Admafine SC2050)

(I) Energy beam-polymerizable compound: dicyclopentadiene dimethoxy diacrylate (Nippon Kayaku Co., Ltd.: KAYARAD R-684)

(J) Photopolymerization initiator: α-hydroxycyclohexylphenyl ketone (Ciba Specialty Chemicals K. K.: Irgacure 184)

A polypropylene film (thickness: 100 μm, surface tension: 31 mN/m) was used as a base material for the adhesive sheet.

EXAMPLES AND COMPARATIVE EXAMPLES

Adhesive compositions having compositions shown in Table 1 were used. Values in the Table represent parts by weight reduced to a involatile component. The adhesive compositions having compositions shown in Table 1 were applied on a release film (SP-PET381031C, manufactured by Lintec Corporation) subjected to silicone treatment so that a thickness was 5 μm, dried (drying conditions: 100° C., one minute in an oven) and then adhered onto a base material to transfer the adhesive layer on the base material, whereby adhesive sheets were obtained.

The aforementioned three tests were performed using the obtained adhesive sheets. The results are shown in Table 2.

TABLE 1

| Component | | Example 1 | Comparative example 1 | Comparative example 2 |
|---|---|---|---|---|
| Acrylic polymer | A | 100 | 100 | 100 |
| Epoxy resin | B-1 | 403 | 403 | 403 |
| | B-2 | 269 | 269 | 269 |
| | B-3 | 90 | 90 | 90 |
| Thermosetting agent | C | 224 | 224 | 224 |
| Silicone compound | D-1 | 6 | | |
| | D-2 | | | 6 |
| Thermosetting accelerating agent | E | 18 | 18 | 18 |
| Coupling agent | F | 12 | 12 | 12 |
| Silica filler | H | 200 | 200 | 200 |
| Energy beam-polymerizable compound | I | 83 | 83 | 83 |
| Photopolymerization initiator | J | 0.2 | 0.2 | 0.2 | unit: parts by weight(reduced to involatile component)

TABLE 2

| | Picking-up Load Measurement/gf | Picking-up Test | Results of Wire Pulling Test |
|---|---|---|---|
| Example 1 | 53 | 20/20 | 20/20 |
| Comparative Example 1 | 103 | 16/20 | 20/20 |
| Comparative Example 2 | 48 | 20/20 | 17/20 |

INDUSTRIAL APPLICABILITY

According to the adhesive sheet utilizing the adhesive composition of the present invention, conforming products can be produced with a high manufacturing yield and without breaking or chipping of the chips in the picking-up step even in the case of chips being reduced in a thickness. Further, a wire can be stably connected without contaminating a wire pad part disposed at the circumference of a bonding surface during a wire bonding step that is performed after die bonding even in the case of chips being reduced in a thickness.

Furthermore, according to the present invention, a production method of a semiconductor device is provided.

What is claimed is:

1. An adhesive composition comprising:
    (A) an acrylic polymer;
    (B) an epoxy resin;
    (C) a thermosetting agent; and
    (D) a silicone compound,
    wherein the silicone compound (D) is an organopolysiloxane having an aromatic ring-containing group (except for a reactive organic functional group) as a side chain and has a kinematic viscosity of 50 to 100,000 mm$^2$/s at 25° C.

2. The adhesive composition according to claim 1, wherein the aromatic ring-containing group is an aralkyl group.

3. The adhesive composition according to claim 1, wherein the thermosetting agent (C) is a thermosetting agent having a phenolic hydroxyl group and/or an amino group.

4. The adhesive composition according to claim 2, wherein the thermosetting agent (C) is a thermosetting agent having a phenolic hydroxyl group and/or an amino group.

5. An adhesive sheet comprising a base material and, formed thereon, an adhesive layer comprising:
    (A) an acrylic polymer;
    (B) an epoxy resin;
    (C) a thermosetting agent; and
    (D) a silicone compound,
    wherein the silicone compound (D) is an organopolysiloxane having an aromatic ring-containing group (except for a reactive organic functional group) as a side chain and has a kinematic viscosity of 50 to 100,000 mm$^2$/s at 25° C.

6. The adhesive sheet according to claim 5, wherein the aromatic ring-containing group is an aralkyl group.

7. The adhesive sheet according to claim 5, wherein the thermosetting agent (C) is a thermosetting agent having a phenolic hydroxyl group and/or an amino group.

8. The adhesive sheet according to claim 6, wherein the thermosetting agent (C) is a thermosetting agent having a phenolic hydroxyl group and/or an amino group.

9. A production method of a semiconductor device, comprising:
    a step of providing an adhesive sheet comprising a base material and, formed thereon, an adhesive layer comprising, (A) an acrylic polymer;
(B) an epoxy resin;
(C) a thermosetting agent; and
(D) a silicone compound,
wherein the silicone compound (D) is organopolysiloxane having an aromatic ring-containing group (except for a reactive organic functional group) as a side chain and has a kinematic viscosity of 50 to 100,000 mm$^2$/s at 25° C.,
a step of adhering a semiconductor wafer on the adhesive layer of the adhesive sheet,
a step of dicing the semiconductor wafer into chips,
a step of separating the chips from the base material of the adhesive sheet while transferring the adhesive layer to the back side of each of the chips,
a step of thermally bonding each of the separated chips on a die pad part through the adhesive layer transferred to the back side of each of the chips.

10. The production method of a semiconductor device according to claim 9, wherein the aromatic ring-containing group is an aralkyl group.

11. The production method of a semiconductor device according to claim 9, wherein the thermosetting agent (C) is a thermosetting agent having a phenolic hydroxyl group and/or an amino group.

12. The production method of a semiconductor device according to claim 10, wherein the thermosetting agent (C) is a thermosetting agent having a phenolic hydroxyl group and/or an amino group.

* * * * *